(12) United States Patent
Heller et al.

(10) Patent No.: US 9,372,219 B2
(45) Date of Patent: Jun. 21, 2016

(54) BAD GROUND AND REVERSE POLARITY DETECTION FOR HVAC CONTROLS

(71) Applicant: Emerson Electric Co., St. Louis, MO (US)

(72) Inventors: John J. Heller, St. Louis, MO (US); John F. Broker, Warrenton, MO (US)

(73) Assignee: Emerson Electric Co., St. Louis, MO (US)

( * ) Notice: Subject to any disclaimer, the term of this patent is extended or adjusted under 35 U.S.C. 154(b) by 279 days.

(21) Appl. No.: 14/169,360

(22) Filed: Jan. 31, 2014

(65) Prior Publication Data

US 2015/0219699 A1 Aug. 6, 2015

(51) Int. Cl.
*G01R 31/02* (2006.01)

(52) U.S. Cl.
CPC .................................. *G01R 31/025* (2013.01)

(58) Field of Classification Search
CPC . G01R 31/02; G01R 19/16533; G01R 31/025
USPC .............. 324/524, 522, 512, 509, 500, 76.11, 324/133; 340/6.1, 6.12, 6.16, 6.17, 12.12; 361/245, 42, 136
See application file for complete search history.

(56) References Cited

U.S. PATENT DOCUMENTS

| | | | |
|---|---|---|---|
| 5,473,229 A | 12/1995 | Archer et al. | |
| 5,521,482 A | 5/1996 | Lang et al. | |
| 6,062,482 A * | 5/2000 | Gauthier | F24F 11/006 165/267 |
| 6,262,550 B1 | 7/2001 | Kliman et al. | |
| 6,529,135 B1 | 3/2003 | Bowers et al. | |
| 6,646,397 B1 | 11/2003 | Discenzo | |
| 6,658,372 B2 | 12/2003 | Raffaelli et al. | |
| 7,106,019 B2 | 9/2006 | Becerra et al. | |
| 7,268,558 B2 * | 9/2007 | Mills | G01R 31/3277 324/424 |
| 7,301,296 B1 | 11/2007 | Discenzo | |
| 7,538,512 B2 | 5/2009 | Discenzo | |
| 7,539,549 B1 | 5/2009 | Discenzo et al. | |
| 7,671,555 B2 * | 3/2010 | Mullin | F04D 27/004 236/51 |
| 7,949,483 B2 | 5/2011 | Discenzo et al. | |
| 8,067,912 B2 | 11/2011 | Mullin | |
| 2004/0031601 A1 * | 2/2004 | Dage | B60H 1/00821 165/203 |
| 2007/0170171 A1 * | 7/2007 | Shah | G01R 19/0084 219/497 |
| 2007/0284609 A1 * | 12/2007 | Ang | G11C 5/145 257/139 |
| 2009/0222139 A1 * | 9/2009 | Federspiel | F24F 11/006 700/278 |

(Continued)

FOREIGN PATENT DOCUMENTS

| | | |
|---|---|---|
| CN | 101340166 | 1/2009 |
| JP | 2006149044 | 6/2006 |

(Continued)

*Primary Examiner* — Jermele M Hollington
*Assistant Examiner* — Alvaro Fortich
(74) *Attorney, Agent, or Firm* — Harness, Dickey & Pierce, P.L.C.

(57) ABSTRACT

In exemplary embodiments, HVAC controls and corresponding error detection methods are disclosed. In an exemplary embodiment, an HVAC control generally includes a digital input configured to receive a digital signal, an analog input configured to receive an analog signal, and an error indicator. The control is configured to receive a neutral signal at the analog input, determine a voltage of the neutral signal with respect to earth ground, and operate the error indicator to indicate a normal state if the voltage is below a first threshold, a bad ground state if the voltage is between the first threshold and a second threshold, and a reverse polarity state if the voltage is above the second threshold.

20 Claims, 5 Drawing Sheets

(56) References Cited

U.S. PATENT DOCUMENTS

| | | | | |
|---|---|---|---|---|
| 2009/0311892 | A1* | 12/2009 | Weeks | H01R 13/641 439/137 |
| 2010/0066557 | A1* | 3/2010 | Henson | H02H 9/001 340/693.1 |
| 2011/0010015 | A1* | 1/2011 | Jordan | B60H 1/00735 700/280 |
| 2011/0032738 | A1* | 2/2011 | Skinner | H02M 1/4208 363/126 |
| 2012/0134063 | A1* | 5/2012 | Weil | H02H 3/22 361/118 |
| 2012/0222439 | A1* | 9/2012 | Pena | F24F 11/0009 62/150 |
| 2012/0303297 | A1* | 11/2012 | Alley | G01R 31/024 702/58 |
| 2013/0030574 | A1* | 1/2013 | Storm | F24F 11/006 700/276 |
| 2014/0225455 | A1* | 8/2014 | Erwin | G05D 23/19 307/109 |

FOREIGN PATENT DOCUMENTS

| | | |
|---|---|---|
| KR | 1020070018009 | 2/2007 |
| WO | WO2005/073819 | 8/2005 |

\* cited by examiner

BAD GROUND AND REVERSE POLARITY DETECTION FOR HVAC CONTROLS

FIELD

The present disclosure relates to bad ground and reverse polarity detection for HVAC controls.

BACKGROUND

This section provides background information related to the present disclosure which is not necessarily prior art.

Heating, ventilating and air-conditioning (HVAC) systems are used to regulate the environment within an enclosed space. Typically, an air blower is used to pull air from the enclosed space into the HVAC system and then push the air back into the enclosed space after conditioning the air (e.g., heating, cooling or dehumidifying the air). Various types of HVAC systems may be used to provide conditioned air for enclosed spaces. Some HVAC system appliances may not work properly when receiving a bad ground connection or a reverse polarity connection.

SUMMARY

This section provides a general summary of the disclosure, and is not a comprehensive disclosure of its full scope or all of its features.

In exemplary embodiments, HVAC controls and corresponding error detection methods are disclosed. In an exemplary embodiment, an HVAC control generally includes a digital input configured to receive a digital signal, an analog input configured to receive an analog signal, and an error indicator. The control is configured to receive a neutral signal at the analog input, determine a voltage of the neutral signal with respect to earth ground, and operate the error indicator to indicate a normal state if the voltage is below a first threshold, a bad ground state if the voltage is between the first threshold and a second threshold, and a reverse polarity state if the voltage is above the second threshold.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The inventors have observed that when a connection problem occurs in an HVAC control, the control often gives a single error that indicates there is a problem with connections to the control. But the single error does not indicate whether the problem is a bad ground or a reverse polarity. The inventors have also observed that in service of the control after a problem, a service repair technician or user will usually not know how to fix the problem most efficiently. It would be helpful if the control had an error detection method to determine whether an error was due to a bad ground or a reverse polarity connection.

Figure 1:
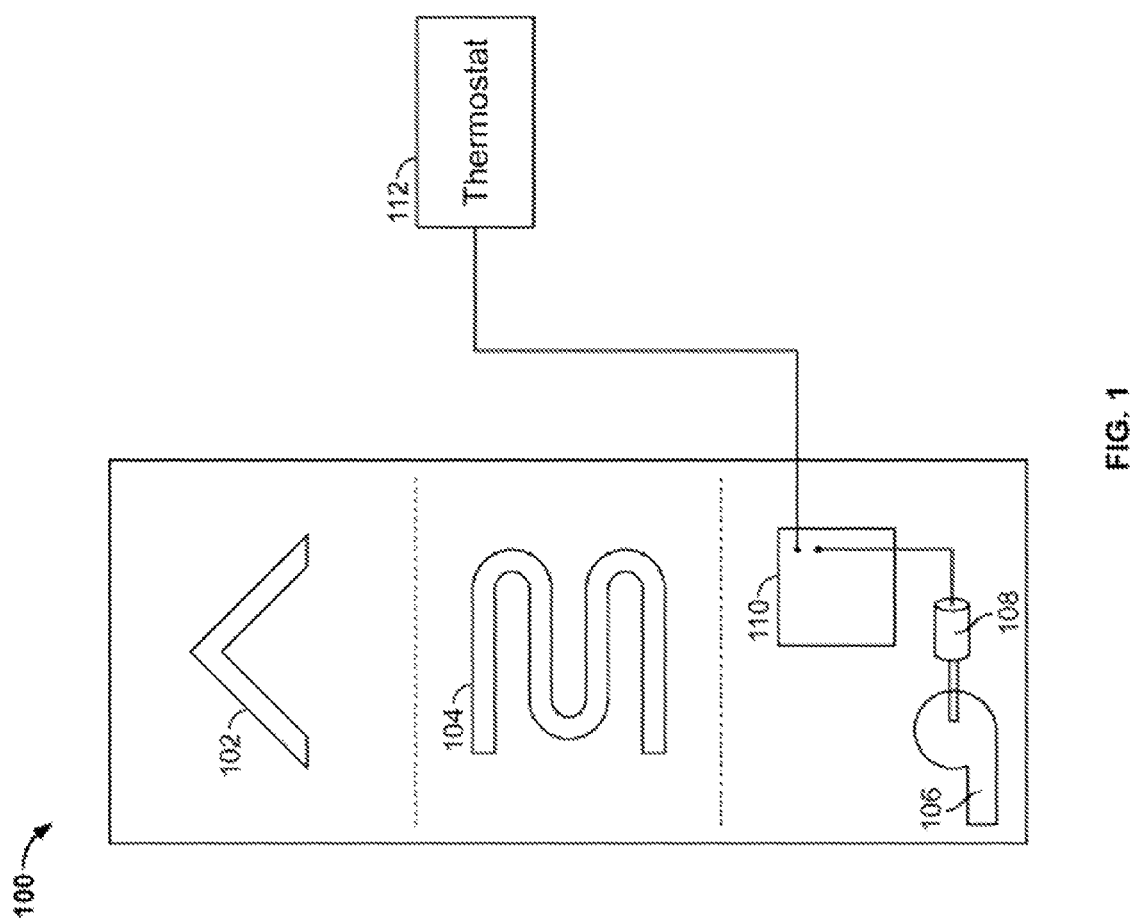
FIG. 1 is a diagram of an example HVAC system configured in accordance with an exemplary implementation of the present disclosure.

With reference to the figures, FIG. 1 illustrates an example HVAC system 100 having an evaporator coil 102 for providing air-conditioning, a heat exchanger 104 for providing heating, and a blower 106 for moving air through the HVAC system 100. The blower 106 is driven by a motor 108. A control 110, which is or includes, for example, an indoor control board, an integrated furnace control, a unitary control, an air handler control, etc., controls the HVAC system 100. A thermostat 112 may provide a demand signal to the control 110 to operate the blower motor 108 at specified parameters to adjust operation of the HVAC system 100 (e.g., low heat, high heat, low cool, high cool, fan only, etc.).

The HVAC system 100 may be operated for heating, cooling, running the fan only, multistage heating or cooling, or other fan setting adjustments. The blower motor 108 may operate at different speeds or torques to circulate different amounts of air through the system depending on the mode of operation of the HVAC system 100. For example, the blower motor 108 may operate at a lower speed to circulate less air when the HVAC system 100 is in a cooling setting, and the blower motor may operate at a higher speed to circulate more air when the HVAC system 100 is in a heating setting. If there is a two stage heating system, there may be two different blower speeds for different heating modes (e.g., low heat and high heat). There could also be a two stage cooling mode requiring two different motor speeds. Further, the blower 106 may be operated to run the fan only without heating or cooling.

Different air circulation needs for different HVAC system settings require the blower motor 108 to be capable of operating at different speeds given the particular HVAC setting. The control 110 can control the speed of the motor by providing the appropriate signal to the motor 108 based on the HVAC system 100 setting. The control 110 may determine the HVAC system 100 setting based on a demand signal from a thermostat 112, user setting, or other HVAC system controller. Typical demand signals may include a W1 signal for low heat, a W2 signal for high heat, and a Y1 signal for low cool.

Figure 2:
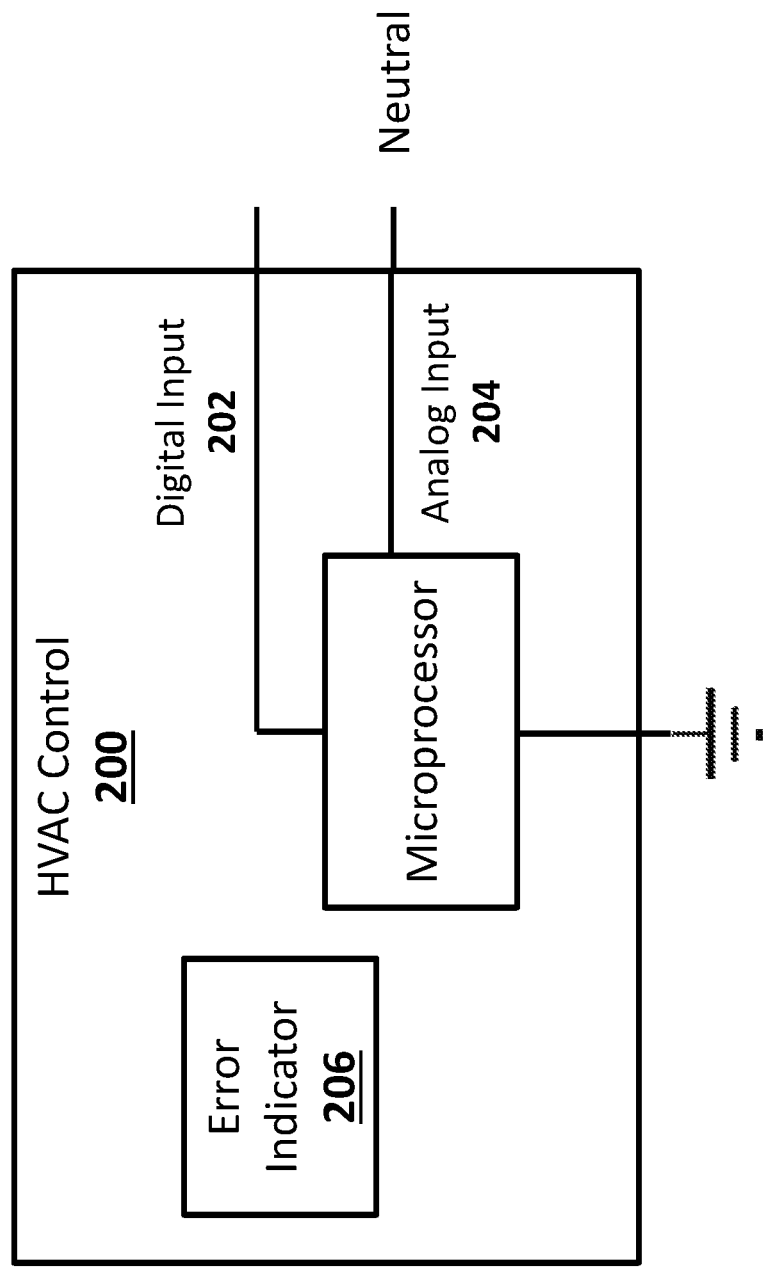
FIG. 2 is a diagram of an example HVAC control configured in accordance with an exemplary implementation of the present disclosure.

In one embodiment of the disclosure, and as shown in FIG. 2, an HVAC control 200 includes a digital input 202 configured to receive a digital signal, an analog input 204 configured to receive an analog signal, and an error indicator 206. The HVAC control 200 is configured to receive a neutral signal at the analog input 204, determine a voltage of the neutral signal with respect to earth ground, and operate the error indicator 206 to indicate a normal state if the voltage is below a first threshold, a bad ground state if the voltage is between the first threshold and a second threshold, and a reverse polarity state if the voltage is above the second threshold.

The HVAC control 200 may be powered by receiving connections from a utility grid, such as, for example, from a breaker box inside a home. The neutral signal may be a signal from a neutral line of a utility grid. The neutral line of a utility grid may be connected to the HVAC control 200. A voltage of the neutral line signal may be read by the analog input 204 of the HVAC control 200. The neutral signal voltage may be determined by measuring a difference between the neutral signal and a voltage reference, such as, for example, an earth ground, chassis ground, etc. For example, if the analog input 204 is an analog to digital (A/D) input of a microprocessor, the analog input 204 might determine the voltage difference between the neutral signal applied to the analog input 204 and the microprocessor ground. The microprocessor ground may be coupled to an earth ground such that the analog input 204 measures the neutral signal voltage with respect to earth ground.

The neutral line signal voltage may be read to determine whether there are any errors in the connections to the HVAC control 200. For example, if the neutral signal is below a first threshold, the neutral line may be connected properly. If the neutral voltage is below the first threshold, the neutral voltage may be determined to be sufficiently close to ground. In some example embodiments, the first threshold may be about twenty volts, such that a neutral signal voltage of less than about twenty volts indicates a proper neutral connection and no errors. If the neutral signal voltage is above twenty volts, there may be a bad ground or reverse polarity connection error.

If the neutral signal voltage is above the first threshold, but below a second threshold, there may be a bad ground connection. In some example embodiments, the second threshold may be about fifty volts. For example, if the neutral signal is between about twenty and about fifty volts, it may indicate a bad ground connection error. If wired properly, the neutral signal may be at about the same voltage as ground. If the neutral signal is more than twenty volts, it may indicate an error in the ground signal causing the ground signal to be more than twenty volts different from the neutral signal voltage. A difference in voltage of more than twenty volts may indicate a bad ground connection error, such that the ground connection is not sufficient for use for the HVAC control 200 to work properly.

If the neutral signal voltage is above the second threshold, there may be a reverse polarity connection. For example, if the neutral signal is above fifty volts, it may indicate that a reverse polarity is connected. A technician or user may improperly connect the line signal from a utility grid to the HVAC control neutral signal input instead of connecting the neutral signal from the utility grid to the HVAC control neutral signal input. If the line signal from the utility grid is normally about 120 volts, the HVAC control 200 may detect this error by determining the neutral signal voltage as greater than fifty volts. A neutral signal more than fifty volts may indicate that the error is more than just a bad ground, but instead is a reverse polarity in which the line from the utility grid has been connected to the neutral signal input of the HVAC control 200 instead of the neutral signal from the utility grid being connected to the neutral signal input of the HVAC control 200.

Although example first and second thresholds of twenty and fifty volts have been described, it is understood that other voltages may be selected for the first and second thresholds in other embodiments. For example, the first threshold may be selected at any voltage desirable to differentiate between a small difference in ground and neutral signal voltage and an unacceptable difference that should be recognized as a bad ground connection error. Similarly, the second threshold may be selected at any voltage desirable to differentiate between a difference in voltage indicating a bad ground connection error and a larger voltage difference indicating that a reverse polarity has been connected. The voltage may be an alternating current voltage (VAC), a direct current voltage (VDC), a combination of VAC and VDC, etc.

The error indicator 206 may be any indicator suitable for indicating the error status of connections to the HVAC control 200, such as, for example, one or more displays, light bulbs, light emitting diodes (LEDs), liquid crystal displays (LCDs), seven segment displays, etc.

The HVAC control 200 may include any type of device capable of controlling the one or more components of an HVAC system, such as, for example, a microprocessor, microcontroller, a programmable gate array, a logic device, an ASIC, etc. The digital input 202 of the HVAC control 200 may be any input capable of receiving digital signals, such as, for example, a microprocessor digital input pin, a digital I/O pin, etc. The analog input 204 of the HVAC control 200 may be any input capable of receiving analog signals, such as, for example, a microprocessor analog input pin, an analog to digital converter input, etc. The HVAC control 200 may comprise, or be a part of, for example, an integrated furnace control, a unitary control, an air handler, etc.

Figure 3:
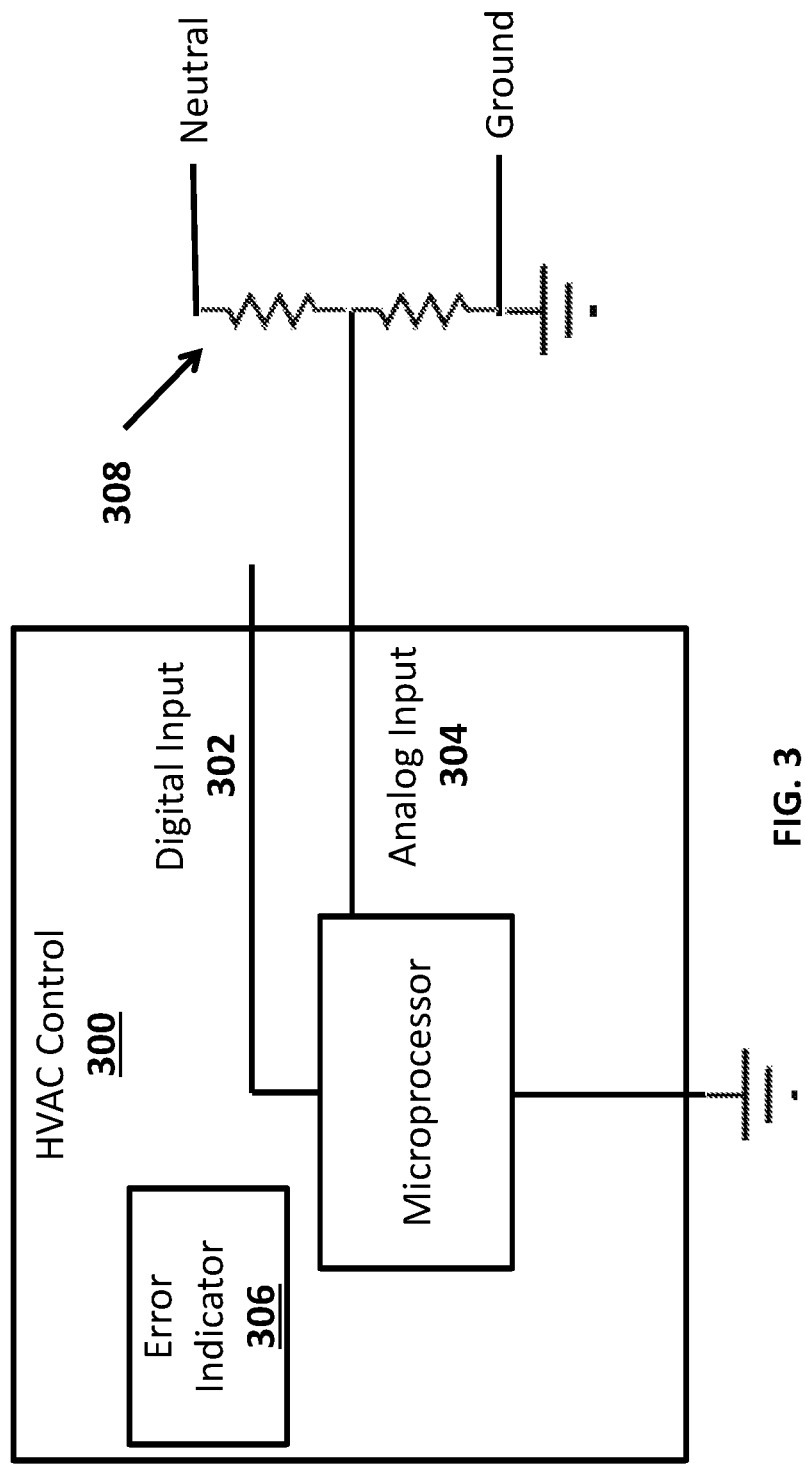
FIG. 3 is a diagram of an example HVAC control having a resistor divider circuit configured in accordance with an exemplary implementation of the present disclosure.

In another embodiment of the present disclosure, and as shown in FIG. 3, an HVAC control 300 includes a digital input 302 configured to receive a digital signal, an analog input 304 configured to receive an analog signal, and an error indicator 306. The HVAC control 300 also includes a resistor divider circuit 308 (alternatively, reverse polarity circuit).

The resistor divider circuit 308 may be coupled to the analog input 304. The resistor divider circuit 308 may be configured to receive a neutral signal and scale the neutral signal voltage to a voltage level capable of being safely read by the analog input 304. For example, the neutral signal may be from a utility grid and may be a 120 volt alternating current (VAC) signal, but the analog input 304 may be a microprocessor input capable of safely reading, for example, signals of about five volts or less. The resistor divider circuit 308 may be used to convert the voltage from a higher harmful voltage to a lower safe voltage for the analog input 304 to read.

Although the resistor divider circuit 308 is illustrated as having only two resistors, it is understood that other circuit arrangements and/or components may be used, such as, for example, a network of resistors and capacitors. The resistor divider circuit 308 may be designed to provide any scaling factor to convert a signal received at the neutral signal from a high voltage to a lower safely readable voltage, such as, for example, dividing by a factor of twenty, fifty, or one hundred. This may scale a neutral signal voltage of about 120 volts down to about three volts or five volts.

In this example embodiment, the analog input 304 may receive a voltage which is a scaled factor of the neutral signal voltage. Depending on the scaling factor of the resistor divider circuit 308, the HVAC control 300 may be able to read the scaled voltage at the analog input 304 and determine a corresponding actual voltage of the neutral signal with respect to earth ground. For example, a five volt signal at the analog input 304 may indicate a neutral signal voltage of about 120 volts, while a 2.5 volt signal at the analog input 304 may indicate a neutral signal voltage of about sixty volts.

The HVAC control 300 may be configured to operate the error indicator 306 to indicate a normal state if the voltage is below a first threshold, a bad ground state if the voltage is between the first threshold and a second threshold, and a reverse polarity state if the voltage is above the second threshold. The first threshold may be a scaled voltage value corresponding to a neutral signal value of about twenty volts. The second threshold may be a scaled voltage value corresponding to a neutral signal value of about fifty volts. In other embodiments, other scaled voltage values may be used for the first and second thresholds.

The HVAC control 300 may be powered by receiving connections from a utility, such as, for example, from a breaker box inside a home. The neutral signal may be a signal from a neutral line of a utility grid. The neutral line of a utility grid may be connected to the HVAC control 300. If the HVAC control 300 is wired properly to the neutral line of the utility grid, and the neutral signal of the utility grid is about the same voltage as ground, the analog input 304 may receive a low signal, and may indicate no errors. If the line from the utility grid is actually wired to the neutral signal input of the HVAC control 300 instead of the neutral signal from the utility grid being wired to the neutral signal input of the HVAC control 300, the analog input 304 may receive a high signal, and may indicate a reverse polarity. If the ground is sufficiently off from the neutral voltage, but not as much as a reverse polarity, the analog input 304 may receive an intermediate signal, and may indicate a bad ground.

Figure 4:
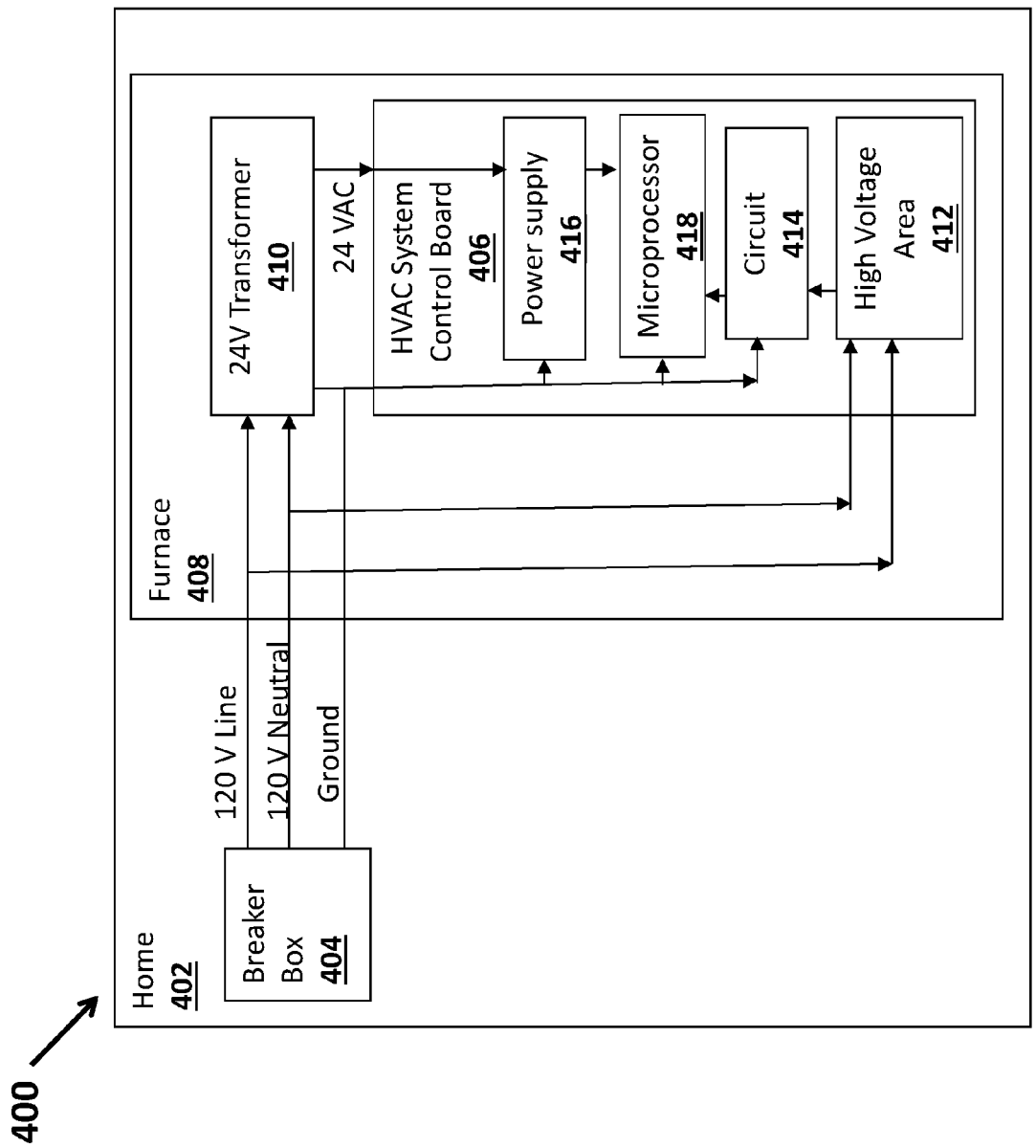
FIG. 4 is a diagram of an example HVAC system configured in accordance with an exemplary implementation of the present disclosure.

According to another example embodiment, an HVAC system is shown in FIG. 4, referenced generally as 400. In this example embodiment, the HVAC system 400 is located inside of a home 402. A breaker box 404 provides power to the HVAC system 400 through a 120 volt line connection, a 120 volt neutral connection, and a ground connection. An HVAC system control board 406 is located in a furnace 408. The furnace 408 also includes a transformer 410 configured to receive the connections from the breaker box and convert the voltage to output a 24 VAC signal.

The HVAC control board 406 includes a high voltage area 412 configured to receive the line and neutral connections from the breaker box 404. The control board 406 also includes a circuit 414 receiving an input from the high voltage area 412 and a ground connection from the breaker box 404. The HVAC control board 406 further includes a power supply 416 receiving an input from the transformer 410 and a ground connection from the breaker box 404. Additionally, the HVAC control board 406 further includes a microprocessor 418 receiving an input from the circuit 414, the power supply 416, and a ground connection from the breaker box 404. Although FIG. 4 illustrates one example arrangement of electrical connections for the HVAC system 400, it is understood that other embodiments may include more or less system components and/or use other connection arrangements without departing from the scope of this disclosure.

Figure 5:
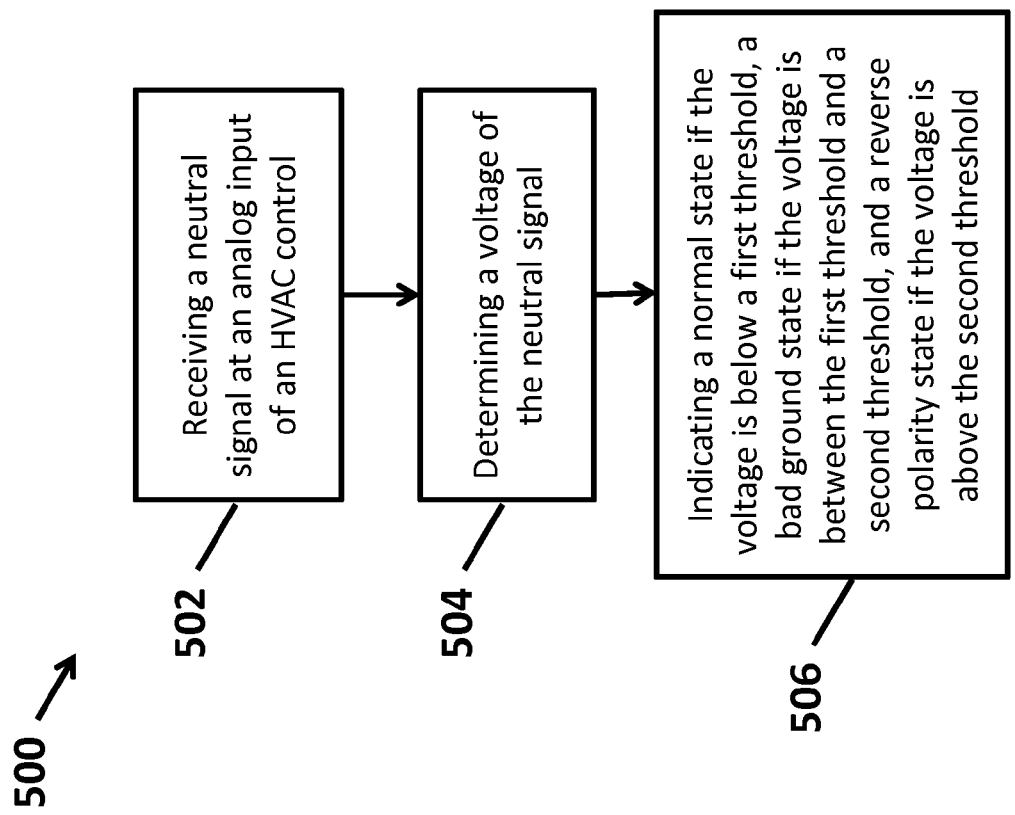
FIG. 5 is a block diagram of an error detection method for an HVAC control in accordance with an exemplary implementation of the disclosure.

According to another example embodiment, a method of HVAC control error detection is shown in FIG. 5, referenced generally as method 500. At step, process, or operation 502, the method includes receiving a neutral signal at an analog input of an HVAC control. At step, process, or operation 504, the method includes determining a voltage of the neutral signal with respect to earth ground. At step, process, or operation 506, the method includes indicating a normal state if the voltage is below a first threshold, a bad ground state if the voltage is between the first threshold and a second threshold, and a reverse polarity state if the voltage is above the second threshold.

Some of these example embodiments provide increased error detection information to the user, for example, determining whether an HVAC control has a bad ground or a reverse polarity. The improved error detection may point a technician to a more specific failure location. The technician may be able to better determine what changes must be made to fix the HVAC control error. For example, by taking the neutral signal from a reverse polarity circuit and putting it into an analog input of a microprocessor instead of a digital I/O pin, the voltage of the neutral signal may be read to determine if the HVAC control has a bad ground or if the wiring is wired in reverse to create a reverse polarity. In some embodiments, a neutral signal voltage of less than about twenty volts may indicate normal wiring, a neutral signal voltage between about twenty volts and about fifty volts may indicate a bad ground connection, and a neutral signal voltage above about fifty volts may indicate a reverse polarity connection.

Some of these embodiments may allow a technician to fix connection problems more efficiently. If HVAC equipment is installed incorrectly, such as line and neutral connections reversed or a bad ground connection, the technician may be able to find the problem and fix it right on the spot. These HVAC control error detection methods may be used with any suitable HVAC system components, such as, for example, furnaces, igniters, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An HVAC control comprising:
a digital input configured to receive a digital signal;
an analog input configured to receive an analog signal; and
an error indicator;
the HVAC control configured to receive a neutral signal at the analog input, measure a voltage of the neutral signal with respect to earth ground, to operate the error indicator to provide a first indicator status indicative of a normal state if the measured voltage is below a first voltage threshold, to operate the error indicator to provide a second indicator status indicative of a bad ground state if the measured voltage is between the first voltage threshold and a second voltage threshold, and to operate the error indicator to provide a third indicator status indicative of a reverse polarity state if the measured voltage is above the second voltage threshold;
wherein the first voltage threshold and the second voltage threshold are different, and wherein the first indicator status, the second indicator status and the third indicator status are different.

2. The HVAC control of claim 1, wherein the first voltage threshold is 20 VAC.

3. The HVAC control of claim 1, wherein the second voltage threshold is 50 VAC.

4. The HVAC control of claim 1, wherein the HVAC control is a microprocessor.

5. The HVAC control of claim 1, wherein the analog input is coupled to a neutral line of a utility grid.

6. The HVAC control of claim 1, further comprising a resistor divider circuit coupled to the analog input, the resistor divider circuit configured to receive the neutral signal and scale the neutral signal voltage to a voltage level capable of being safely read by the analog input.

7. The HVAC control of claim 6, wherein the first voltage threshold is a scaled voltage corresponding to a neutral signal voltage received at the resistor divider circuit of 20 VAC.

8. The HVAC control of claim 6, wherein the second voltage threshold is a scaled voltage corresponding to a neutral signal voltage received at the resistor divider circuit of 50 VAC.

9. The HVAC control of claim 6, wherein:
the first voltage threshold is a scaled voltage corresponding to a neutral signal voltage received at the resistor divider circuit of 20 VAC; and
the second voltage threshold is a scaled voltage corresponding to a neutral signal voltage received at the resistor divider circuit of 50 VAC.

10. The HVAC control of claim 1, wherein:
the first voltage threshold is 20 VAC; and
the second voltage threshold is 50 VAC.

11. An HVAC control comprising:
a digital input configured to receive a digital signal;
an analog input configured to receive an analog signal;
an error indicator;

the HVAC control configured to receive a neutral signal at the analog input, measure a voltage of the neutral signal, to operate the error indicator to provide a first indicator status indicative of a normal state if the measured voltage is below a first voltage threshold, to operate the error indicator to provide a second indicator status indicative of a bad ground state if the measured voltage is between the first voltage threshold and a second voltage threshold, and to operate the error indicator to provide a third indicator status indicative of a reverse polarity state if the measured voltage is above the second voltage threshold; and a resistor divider circuit coupled to the analog input, the resistor divider circuit configured to receive the neutral signal and scale the neutral signal voltage to a voltage level capable of being safely read by the analog input;

wherein the first voltage threshold and the second voltage threshold are different, and wherein the first indicator status, the second indicator status and the third indicator status are different.

12. The HVAC control of claim 11, wherein:
the first voltage threshold is a scaled voltage corresponding to a neutral signal voltage received at the resistor divider circuit of 20 VAC; and/or
the second voltage threshold is a scaled voltage corresponding to a neutral signal voltage received at the resistor divider circuit of 50 VAC.

13. The HVAC control of claim 11, wherein the HVAC control is a microprocessor.

14. The HVAC control of claim 11, wherein the analog input is coupled to a neutral line of a utility grid.

15. A method of HVAC control error detection, the method comprising:

receiving a neutral signal at an analog input of an HVAC control;

measuring a voltage of the neutral signal; and providing a first indication status of a normal state if the voltage is below a first voltage threshold, providing a second indication status of a bad ground state if the voltage is between the first voltage threshold and a second voltage threshold, and providing a third indication status of a reverse polarity state if the voltage is above the second voltage threshold;

wherein the first voltage threshold and the second voltage threshold are different, and wherein the first indication status, the second indication status and the third indication status are different.

16. The method of claim 15, wherein:
the first voltage threshold is 20 VAC; and/or
the second voltage threshold is 50 VAC.

17. The method of claim 15, wherein the HVAC control is a microprocessor.

18. The method of claim 15, wherein the analog input is coupled to a neutral line of a utility grid.

19. The method of claim 15, wherein a resistor divider circuit is coupled to the analog input, the resistor divider circuit configured to receive the neutral signal and scale the neutral signal voltage to a voltage level capable of being safely read by the analog input.

20. The method of claim 19, wherein:
the first voltage threshold is a scaled voltage corresponding to a neutral signal voltage received at the resistor divider circuit of 20 VAC; and/or
the second voltage threshold is a scaled voltage corresponding to a neutral signal voltage received at the resistor divider circuit of 50 VAC.

* * * * *